United States Patent [19]

Backes

[11] Patent Number: 4,931,909
[45] Date of Patent: Jun. 5, 1990

[54] ALIGNING BRACKET FOR A CIRCUIT BOARD IN A CIRCUIT BOARD HOUSING

[75] Inventor: James J. Backes, Hales Corners, Wis.

[73] Assignee: Square D Company, Palatine, Ill.

[21] Appl. No.: 322,798

[22] Filed: Mar. 13, 1989

[51] Int. Cl.⁵ .............................................. H05K 7/02
[52] U.S. Cl. .................................... 361/399; 361/380; 361/427
[58] Field of Search ............... 340/641, 762, 782, 693; 361/390, 391, 400, 427, 340, 380, 395, 399; 307/150

[56] References Cited

U.S. PATENT DOCUMENTS

| | | | |
|---|---|---|---|
| 3,934,177 | 1/1976 | Horbach | 361/427 |
| 4,053,785 | 10/1977 | Lee | 340/693 |
| 4,674,008 | 6/1987 | Oyama | 361/400 |
| 4,679,728 | 7/1987 | Gregory | 361/391 |
| 4,716,497 | 12/1987 | Craker | 361/399 |
| 4,717,216 | 1/1988 | Hornak | 361/399 |

Primary Examiner—Gerald P. Tolin
Attorney, Agent, or Firm—Thomas K. Stine; Michael J. Femal

[57] ABSTRACT

A circuit board housing 10 includes a front wall 26 which has openings therein for exposing input/output devices on the circuit board 12. A bracket 70 has L-shaped tab 92 and L-extension 82 for maintaining alignment between the input/output devices 64 and the windows 60. The housing also has a removable cover 50 and a removable door 80 that are easily removable for ready access to internal components.

3 Claims, 3 Drawing Sheets

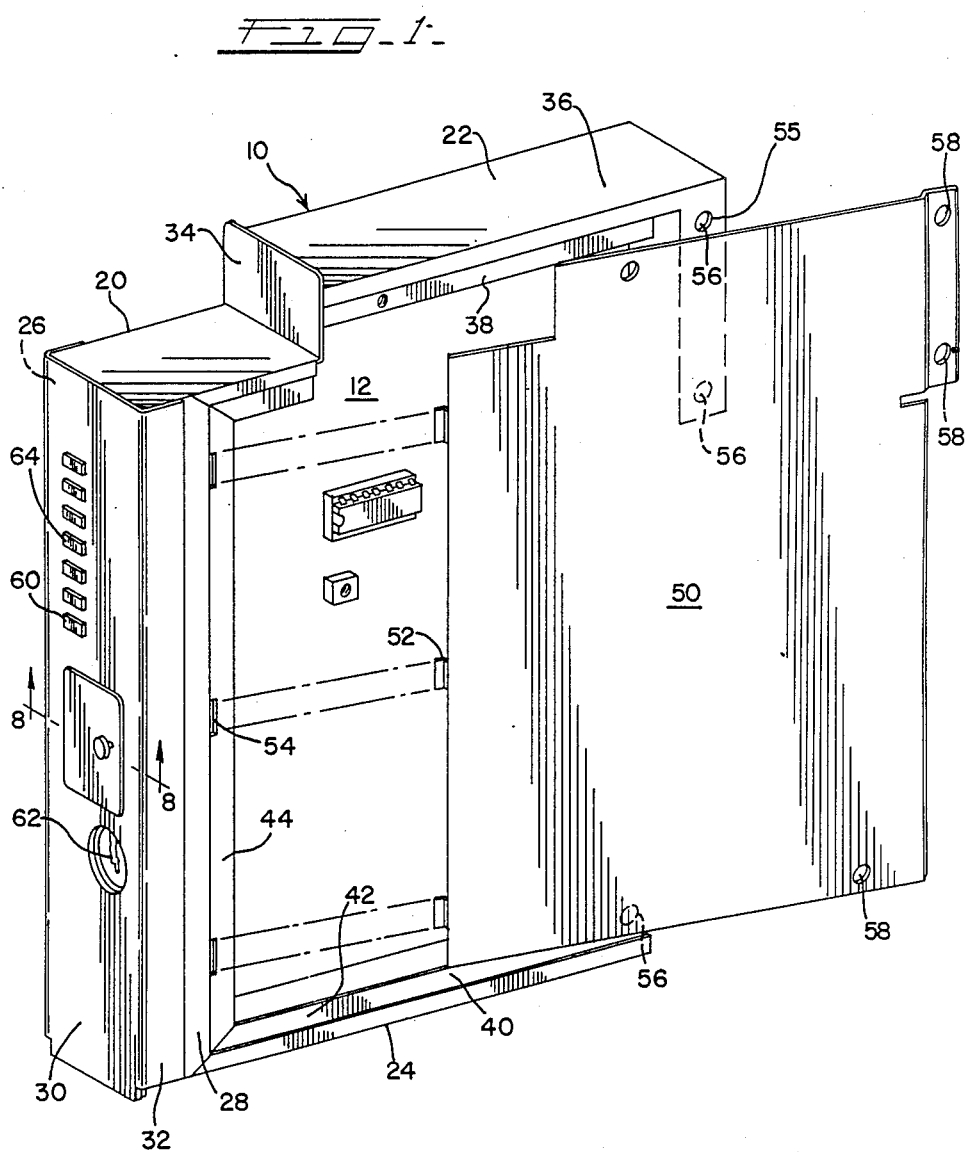

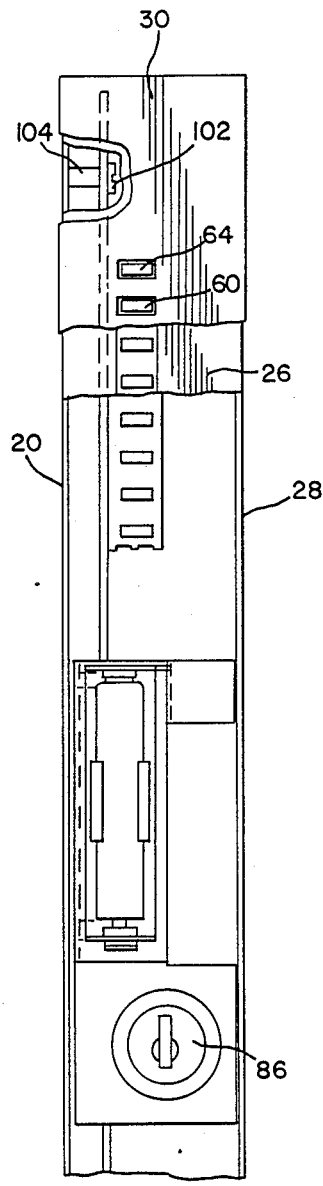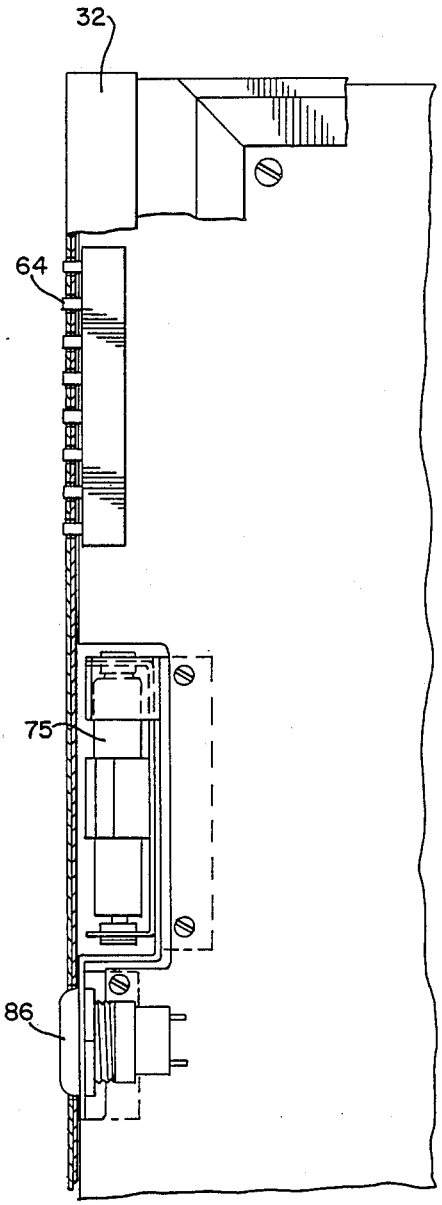

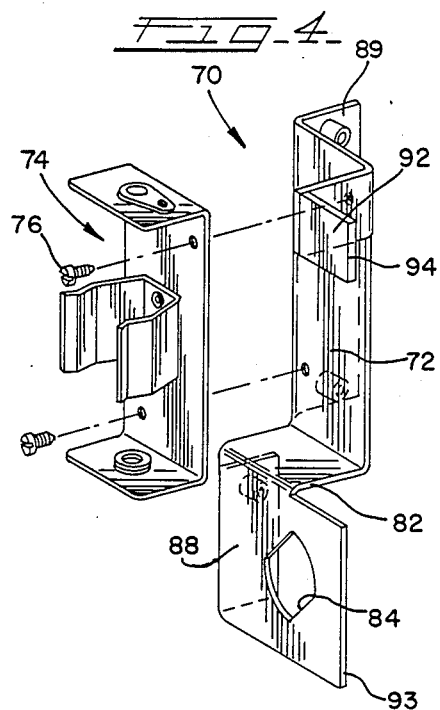
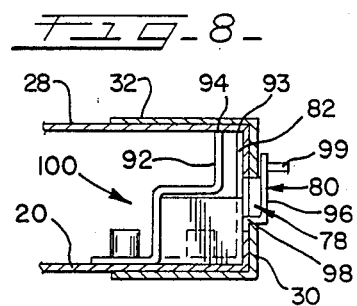
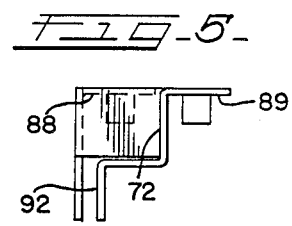
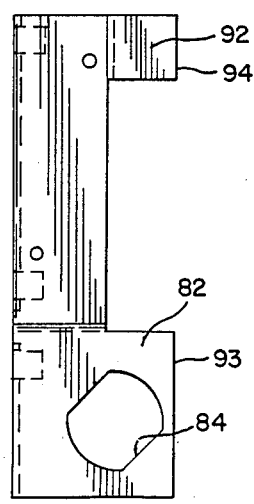
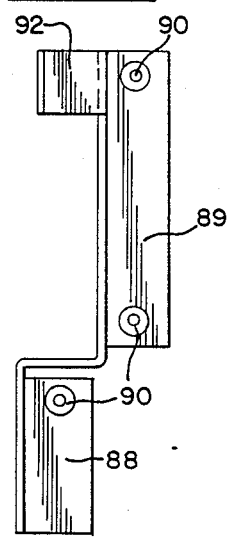

4,931,909

ALIGNING BRACKET FOR A CIRCUIT BOARD IN A CIRCUIT BOARD HOUSING

DESCRIPTION

1. Technical Field

The present invention relates generally to electrical control mechanisms and more particularly to a housing for a circuit board that performs a number of control functions.

2. Background Art

Circuit boards supporting a plurality of interconnected electric components to perform a variety of control functions are well known. In many instances, a plurality of such circuit boards are electrically interconnected to form programmable logic controllers (PLCs) that are normally used to control a number of functions in a manufacturing operation. These programmable logic controllers are often of necessity located on the plant floor and thus are subject to considerable abuse.

The circuit boards are made of a non-metallic material and are normally mounted in a sturdy housing. The circuit boards typically have various input/output devices which must be outwardly exposed to permit operator monitoring and/or actuation. For example, circuit boards of this type can have a key switch control and a plurality of light emitting diodes (LEDs) that are outwardly exposed through windows formed in the housing wall. The key switch control provides secured operation of the PLC. The LEDs provide a visual indication of the operation of the circuit board. In addition, the circuit boards can have communication ports for coupling the circuit boards to other equipment. The communication ports are also exposed through windows formed with the housing wall. Electrical connections between the electrical components and the circuit boards are usually made through solder that is applied directly to the board. Because of the numerous electrical connections made with solder, the non-metallic boards may become warped due to the massive amount of solder that is applied to the boards. This warp creates problems in misalignment between the input/output devices and their associated housing windows.

It is also well known that the circuit boards require frequent replacement when a malfunction occurs. Since a malfunction of necessity shuts down the machine operation, replacement must be made in a minimum amount of time.

The present invention provides a simplified housing construction which maintains accurate alignment between the input/output devices and the associated windows in the housing and also provides a novel cover which can be removed quickly to gain access to the electrical components on the circuit board.

SUMMARY OF THE INVENTION

According to the present invention, the circuit board housing has a base or bottom wall, side walls, a front wall and a top wall segment that cooperate to define a rearwardly opening channel. The front wall has a plurality of windows or openings for exposing a plurality of input/output devices.

The circuit board has bracket means secured adjacent a front edge thereof, and the bracket means are received into the channel and have laterally spaced contact points which respectively engage the bottom wall and the top wall segment. More specifically, the bracket means includes a tab extending from the main body which has a free edge that engages top wall segment. The bracket supports an internal power supply, such as a removable battery and an input/output device, such as a key switch control.

According to one aspect of the invention, the front wall has a first opening which receives the key switch control and an access opening for the battery. A removable door closes the access opening and includes a plate that has an offset flange at one edge which is received under an edge of the access opening and is retained by a single fastener.

According to one further aspect of the present invention, a removable cover defines an extension of the top wall segment and is hinged thereto by a plurality of tabs received into slots in the top wall segment so that the cover can be secured to the side wall by fasteners.

BRIEF DESCRIPTION OF DRAWINGS

FIG. 1 is an exploded perspective view of the a circuit board constructed in accordance with the teachings of the present invention;

FIG. 2 is a fragmentary plan view with parts thereof broken away showing the bracket means and the circuit board;

FIG. 3 is a front view with parts broken away showing the front wall of the housing;

FIG. 4 is an exploded perspective view of the bracket;

FIG. 5 is an end view of the bracket;

FIG. 6 is a side elevational view of the bracket;

FIG. 7 is a top plan view of the bracket; and,

FIG. 8 is a cross-sectional view as viewed along line 8—8 of FIG. 1.

DETAILED DESCRIPTION

While this invention is susceptible of embodiment in many different forms, there is shown in the drawings and will herein be described in detail a preferred embodiment of the invention with the understanding that the present disclosure is to be considered as an exemplification of the principles of the invention and is not intended to limit the broad aspect of the invention to embodiment illustrated.

FIG. 1 of the drawings discloses a housing, generally designated by reference numeral 10, for enclosing a circuit board 12. The housing 10 includes a bottom wall or base 20, a pair of side walls 22 and 24, a front wall 26 and a top wall segment 28. A generally U-shaped cap 30 extends across front wall 26 and has legs 32 which respectively engage the bottom wall 20 and the top wall segment 28.

The side wall 22 has an offset portion defining an abutment 34 which is utilized as a securing means for securing the housing 10 into a rack assembly of the type disclosed in commonly-assigned, co-pending application to Magelat et al., Ser. No. 07/325,414, entitled "A Register Rack Assembly for a Programmable Controller System", incorporated herein by reference. The side wall 22 also has flange portions 36 which have inner offset portions 38.

Side wall 24 also has an inwardly-directed flange 40 which has an offset portion 42, while the top wall segment has an offset flange 44. The offset portions 38, 42 and 44 define a common horizontal surface, for a purpose that will be described later.

According to one aspect of the invention, the housing 10 incorporates a removable cover 50. The cover 50 has a plurality of offset tabs 52 which are received into slots 54 defined between the top wall segment 28 and the offset flange 44. The tabs 52 and slots 54 cooperate to define a hinged axis between the cover 50 and the top wall segment 28. In the assembled condition, the edges of the cover 50 rest on the offset portions 38, 42 and 44 and are secured to the side walls, more particularly the flanges 40 and clip channel 55 through fasteners that extend through openings 56 and 58, respectively located in the offsets 42, 44 of the side walls and the cover. Thus, the cover 50 can be quickly assembled onto the housing by manipulating the tabs 52 into the slots 54 and securing the cover 50 to the housing 10 using fasteners (not shown).

In the assembled condition, the exposed surface of the cover 50 defines an extension of the top wall segment 28 and is held in a secured, fixed position. However, should access be required to the circuit board 12, the cover 50 can be quickly removed merely by removal of two threaded fasteners.

As indicated above, the circuit board 12 incorporates a number of electrical components and the circuit board 12 can be electrically interconnected with other circuit boards to form a programmable logic controller (PLC) of the type that is well known in the art. The circuit board 12 includes input/output devices which must, by necessity, be exposed outside the housing 10 for operator viewing or access. Thus, the front wall 26 and cap 30 have a plurality of windows 60 therein which expose a plurality of the input/output devices, such as light-emitting diodes (LEDs) 64 that are mounted on the circuit board 12. Other components, such as a control switch 62 and a communication port, are located in the windows 60 defined in the front wall 26.

One of the components that is normally incorporated into the PLC is an internal power source, such as a battery, discussed below, which is normally supported on a bracket 70 (FIGS. 4–7) located in close proximity to the front wall 26.

According to the primary aspect of the invention, the bracket 70 is configured such that it is an aligning mechanism for aligning the input/output devices, such as the LEDs 64, with the windows 60.

As shown in FIGS. 4–7, the bracket means is generally designated by reference numeral 70 and includes a main body that has a flat, vertical mounting wall 72 which has a battery-support clip 74 secured thereto by fasteners 76. The battery 75 (FIG. 2) is exposed through an opening 78 in the front wall, which is enclosed by a door 80, to be described later.

The bracket includes a generally L-shaped extension 82 which has an opening 84 for supporting a control switch 86 (FIG. 2). The L-shaped extension has a mounting leg 88, while the wall 72 has a mounting leg 89, both of which have mounting posts 90. The mounting legs 88 and 89 are positioned below the circuit board 12 and are supported on the bottom wall 20 of the housing.

The positioning means includes a generally L-shaped tab 92 which is integral with an upper edge of the mounting wall 72. The spacing between the free edge of the L-shaped tab 92 and the lower surface of the mounting leg 89 is dimensioned such that this dimension is equal to the spacing between the top wall segment 28 and the bottom wall 20. Likewise, the spacing between the free edge 93 of extension 82 and the bottom surface of the mounting leg 88 is equal to the dimension of the U-shaped channel that is defined by the bottom wall 20, the front wall 26 and the top wall 28. It should be noted that the free edge 94 of the L-shaped tab 92 and the free edge 93 of the extension horizontally aligned and the L-shaped tab is rearwardly-offset from the extension 82, as clearly shown in FIG. 8.

Thus, the opposite ends of the bracket cooperate to securely position the ends of the bracket, as well as the circuit board. The multiple-point contact at opposite ends of the bracket 70 with the top segment wall and bottom wall will insure that the front edge of the circuit board is truly horizontal and that the LEDs 64 are properly positioned in the windows 60.

It should be noted that the door 80 is of extremely simplified construction so that it can be secured and removed utilizing a single fastener. Thus, as shown in FIG. 8, the door consists of a main body 96 that has an L-shaped extension 98 which has its free end received under the edge of the cap 30 and is secured by a single threaded fastener 99.

The circuit board 12 is positioned in the housing 10 by sliding the bracket 70 into the U-shaped channel 100 defined by the top wall 28, bottom wall 20 and front wall 26 so that mounting legs 88, 89 engage bottom wall 20 while tabs 92 and extension 82 engage top wall 28 to produce multiple point contact at laterally-spaced points in the channel. The circuit board is then secured into position by fasteners 102 received into mounting posts 104.

Thus, it will be appreciated that the simple addition of an aligning tab to a bracket which already forms part of the circuit board provides an extremely inexpensive mechanism for aligning the edge of the circuit board with respect to the windows and openings in the front wall of the housing. It will be appreciated that while this constructed is shown as being incorporated into an already-existing bracket, further positioning brackets could be provided, for example, at opposite ends of the front edge of the circuit board.

While the specific embodiments have been illustrated and described, numerous modifications come to mind without significantly departing from the spirit of the invention and the scope of protection is only limited by the scope of the accompanying claims.

I claim:

1. A housing including a circuit board, the housing comprising:
   a base having an upstanding front wall and side walls,
   a removable cover enclosing said base, said front wall of said base having spaced slots and said removable cover having projections received into said slots so that said cover can be positioned over said base by manipulation thereof relative to said base,
   fastener means for releasably retaining said cover on said base,
   a circuit board secured to said base and having a plurality of components thereon, said front wall having openings for receiving said components with means for securing said circuit board to said base and maintaining alignment between said openings and said components, and
   a bracket disposed on said circuit board adjacent said front wall and defining a battery holder, said front wall including a front wall opening aligned with said bracket, said bracket including locator means for alignably positioning said circuit board within said housing.

2. The housing as defined in claim 1, further including a door releasably retained in said front wall opening.

3. The housing as defined in claim 1, in which said front wall has a top wall segment, front wall and bottom wall cooperatively define a channel, and said locator means includes a positioning tab disposed in said channel and engaging said top wall segment and a portion of said bottom wall.

* * * * *